(12) United States Patent
Shiobara et al.

(10) Patent No.: US 8,187,797 B2
(45) Date of Patent: May 29, 2012

(54) METHOD OF MANUFACTURING SEMICONDUCTOR DEVICE

(75) Inventors: Eishi Shiobara, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 321 days.

(21) Appl. No.: 12/562,423

(22) Filed: Sep. 18, 2009

(65) Prior Publication Data
US 2010/0104984 A1 Apr. 29, 2010

(30) Foreign Application Priority Data
Oct. 27, 2008 (JP) ................. 2008-275567

(51) Int. Cl.
*G03F 7/26* (2006.01)
*B29C 35/08* (2006.01)
*B28B 7/30* (2006.01)

(52) U.S. Cl. ........ 430/324; 430/394; 430/325; 264/313; 264/496

(58) Field of Classification Search .................. 430/224, 430/314, 256, 328, 394, 330; 264/496
See application file for complete search history.

(56) References Cited

U.S. PATENT DOCUMENTS

| 6,653,030 | B2 | 11/2003 | Mei et al. | |
|---|---|---|---|---|
| 7,077,992 | B2 | 7/2006 | Sreenivasan et al. | |
| 7,351,660 | B2 | 4/2008 | Brewer et al. | |
| 2006/0275018 | A1* | 12/2006 | Chae | 385/147 |
| 2007/0121375 | A1* | 5/2007 | Sewell | 365/171 |

FOREIGN PATENT DOCUMENTS

| JP | 2000-194142 | 7/2000 |
|---|---|---|
| JP | 2001-68411 | 3/2001 |

* cited by examiner

*Primary Examiner* — Kathleen Duda
*Assistant Examiner* — Caleen Sullivan
(74) *Attorney, Agent, or Firm* — Finnegan, Henderson, Farabow, Garrett & Dunner, L.L.P.

(57) ABSTRACT

A template having a first recess pattern is brought into contact with a mask material formed on a substrate. The mask material with which the first recess pattern is filled is cured. A mask material pattern is formed on the substrate by releasing the template from the mask material. A resist pattern is formed to cover a part of the mask material pattern by forming a resist on the mask material pattern and selectively irradiating radiation onto the resist and thereafter developing the resist. The substrate is processed by using the mask material pattern and the resist pattern as a mask.

8 Claims, 14 Drawing Sheets

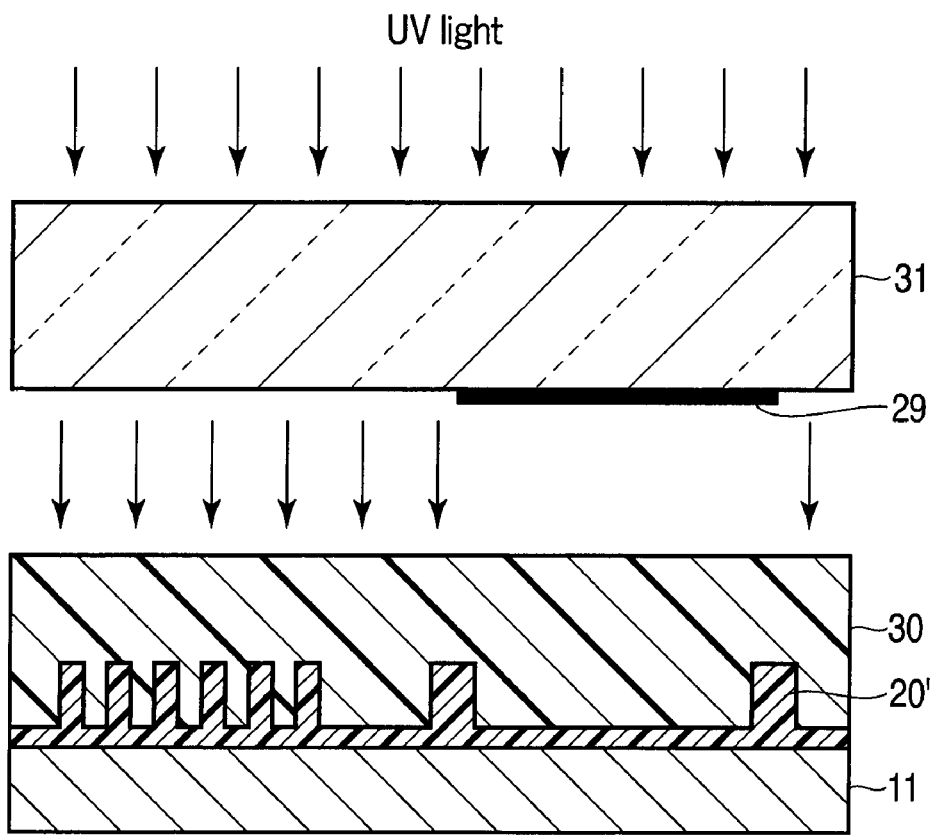
F I G. 8
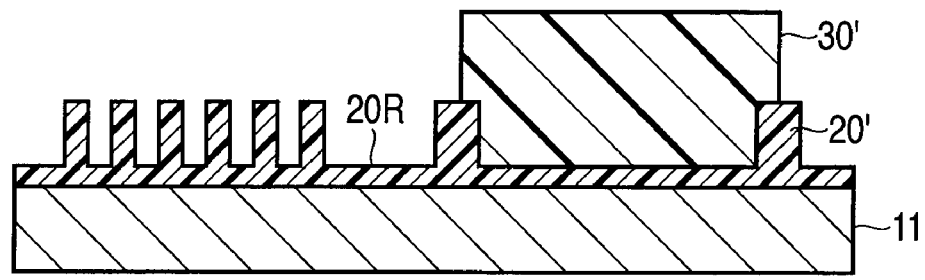
F I G. 9

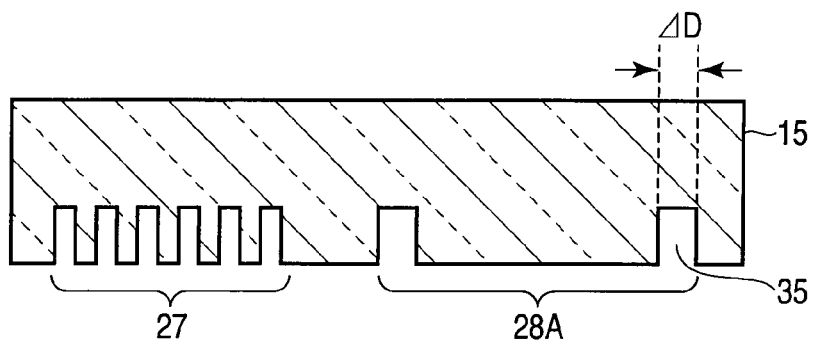
F I G. 10A
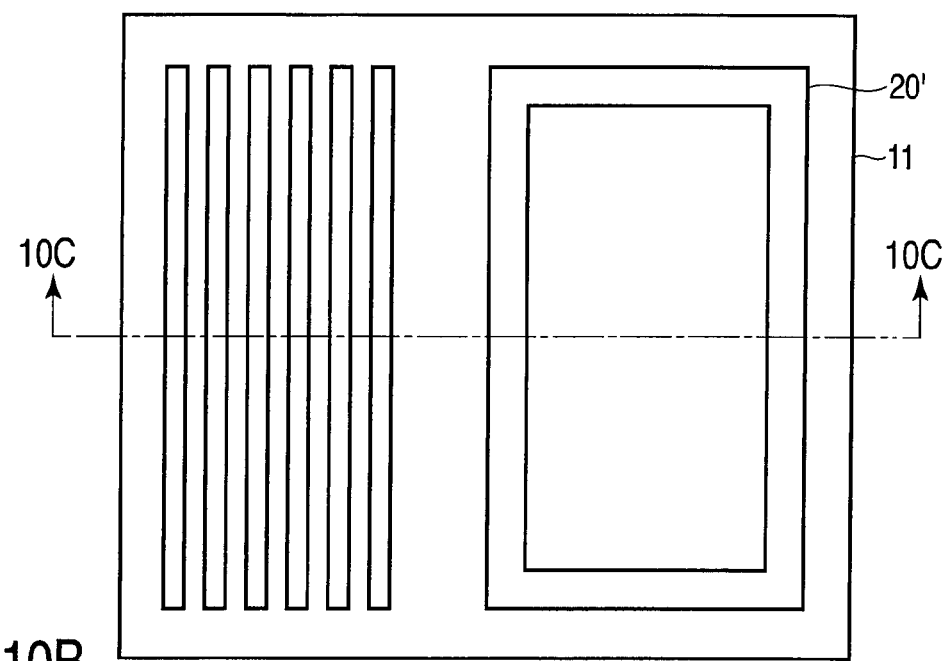
F I G. 10B
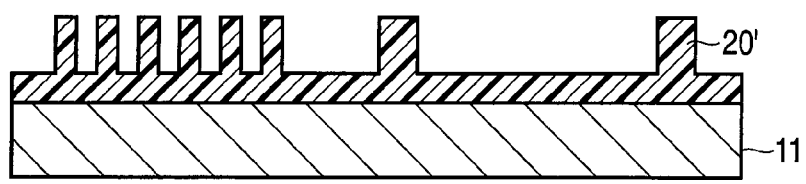
F I G. 10C

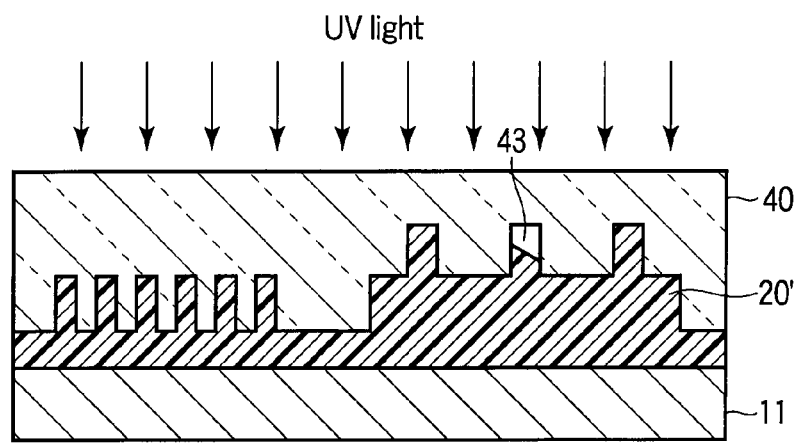
F I G. 20
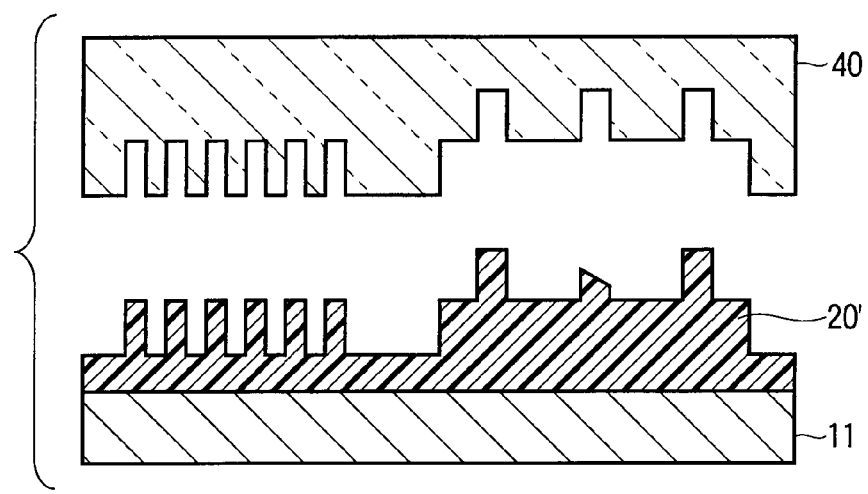
F I G. 21
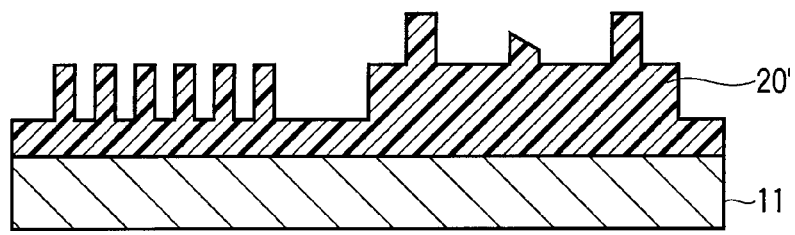
F I G. 22

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2008-275567, filed Oct. 27, 2008, the entire contents of which are incorporated herein by reference.

BACKGROUND OF THE INVENTION

1. Field of the Invention

The present invention relates to a method of manufacturing a semiconductor device in which, for fine patterning, pattern transfer is performed such that an original pattern mold (template) having formed thereon a pattern to be transferred is brought into contact with a substrate to be transferred such as a wafer or the template and the substrate to be transferred are brought close to each other.

2. Description of the Related Art

In methods of manufacturing semiconductor devices, a nanoimprint method in which an original pattern mold is transferred to a substrate to be transferred is attracting attention. The nanoimprint method can achieve both the formation of a fine pattern of 100 nm or less and mass productivity.

The nanoimprint method is a method in which a patterned template is pressed against a resist layer made of an imprint material applied onto a substrate to be transferred and the resist layer is cured, whereby a pattern is transferred to the resist layer. As the nanoimprint method, mainly, a thermal imprint method using a thermoplastic resist and a photo-imprint method using a photocuring resist are known (see, for example, Jpn. Pat. Appln. KOKAI Publication Nos. 2001-68411 and 2000-194142).

By the nanoimprint methods, a pattern of a three-dimensional structure formed on a template can be transferred onto a substrate to be transferred. Hence, a pattern of, for example, a step structure or a lens form can also be transferred onto a substrate to be transferred.

The procedural steps of pattern transfer by a photo-nanoimprint method which is one type of nanoimprint method include, for example, the following (1) to (5):

(1) Apply a photocuring resist which is an imprint material to a substrate to be transferred;
(2) Align and press (bring into contact) the substrate to be transferred and a template;
(3) Cure the resist by light irradiation;
(4) Mold release and rinse; and
(5) Remove remaining films using anisotropic etching mainly by oxygen plasma.

For the application method of a photocuring resist which is an imprint material to a wafer, a spin coat method and an inkjet method are used.

The spin coat method enables to improve throughput. In the spin coat method, however, since an imprint material is a liquid, handling is difficult up to the point of light irradiation. In addition, the use efficiency of an imprint material is poor.

On the other hand, in the inkjet method, steps up to mold release can be performed in an imprint apparatus. Thus, a wafer having a liquid imprint material applied thereto does not have to be moved between manufacturing apparatuses. Hence, the inkjet method is less susceptible to liquid level change, etc. Only one shot (one press by a template) of an imprint material is applied. Thus, the use efficiency of an imprint material is high. However, in application of an imprint material, the amount of discharge needs to be controlled on the order of picoliters. Thus, there is a need to read an amount of discharge from mask pattern data to create a discharge pattern of an imprint material according to the density of a pattern, and control the amount of discharge.

A template used in the photo-nanoimprint method is, for example, a fully transparent quartz substrate which is used for general photomasks, on which a pattern of projections and recesses is formed by plasma etching. Taking a pattern layout of memory devices as an example, a memory cell pattern formed by lines and spaces is formed at a central portion of each chip. Outside the memory cell pattern is formed a peripheral circuit pattern. Furthermore, outside the peripheral circuit pattern is arranged a dicing region serving as a cutting margin portion of the chips. In the dicing region are formed alignment marks for alignment, etc.

Meanwhile, there is a large pattern where a resist of several hundred micrometers or more remains over the peripheral circuit portion and the dicing region. In a large pattern where a resist thus remains over a wide region, the capillary force decreases and thus the filling speed of an imprint material decreases. This causes problems that manufacturing time increases and filling with an imprint material is not sufficient, resulting in a partial loss of a pattern.

BRIEF SUMMARY OF THE INVENTION

According to a first aspect of the invention, there is provided a method of manufacturing a semiconductor device, comprising: bringing a template having a first recess pattern into contact with a mask material formed on a substrate; curing the mask material with which the first recess pattern is filled; forming a mask material pattern on the substrate by releasing the template from the mask material after curing the mask material; forming a resist pattern to cover a part of the mask material pattern by forming a resist that is cured by radiation on the mask material pattern and selectively irradiating radiation onto the resist and thereafter developing the resist; and processing the substrate by using the mask material pattern and the resist pattern as a mask.

According to a second aspect of the invention, there is provided A method of manufacturing a semiconductor device, comprising: bringing a template into contact with a mask material formed on a substrate, the template having a first recess pattern and a second recess pattern that is larger in size than the first recess pattern and that has a groove formed on a bottom face thereof; curing the mask material with which the first recess pattern and the second recess pattern is filled; forming a mask material pattern on the substrate by releasing the template from the mask material after curing the mask material; and processing the substrate by using the mask material pattern as a mask after removing a remaining portion of the mask material.

BRIEF DESCRIPTION OF THE SEVERAL VIEWS OF THE DRAWING

FIGS. 3 to 9 are cross-sectional views showing manufacturing steps of a semiconductor device according to a first embodiment of the present invention;

FIG. 10A is a cross-sectional view of a template used in a photo-nanoimprint step;

FIG. 10B is a plan view of a formed imprint pattern;

FIG. 10C is a cross-sectional view of a substrate to be processed and the imprint pattern;

FIGS. 17 to 22 are cross-sectional views showing manufacturing steps of a semiconductor device according to a second embodiment of the present invention;

DETAILED DESCRIPTION OF THE INVENTION

Embodiments of the present invention will be described below with reference to the drawings.

First Embodiment

Figure 1:
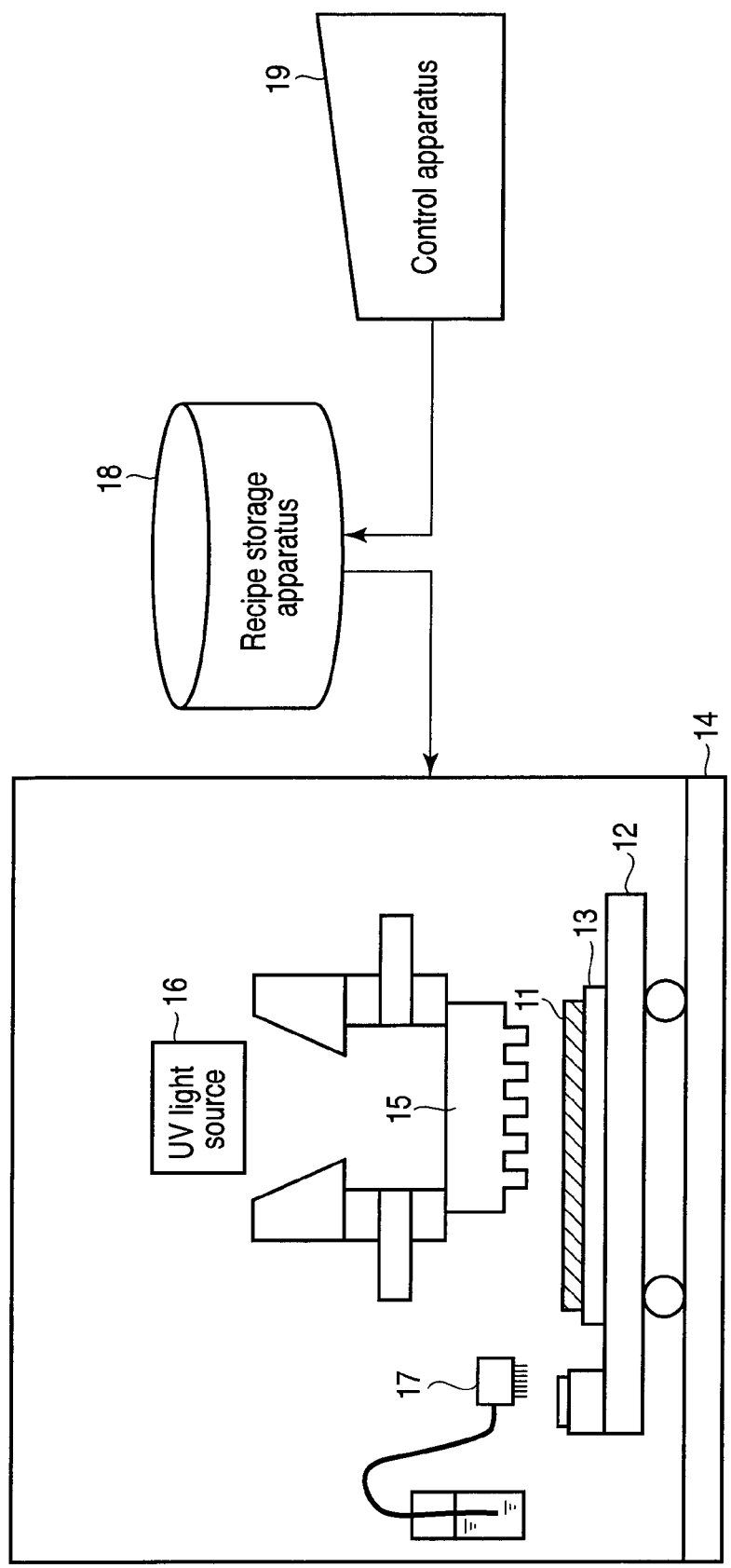
FIG. 1 is a schematic diagram showing a configuration of a photo-nanoimprint apparatus.

FIG. 1 is a schematic diagram showing a configuration of a photo-nanoimprint apparatus. A wafer 11 serving as a substrate to be processed (substrate to be transferred) is absorbed and fixed on a wafer chuck 13 of a wafer stage 12. The wafer stage 12 is placed on a stage surface plate 14 and is movable. A template 15 is disposed so as to face a principal surface (element forming surface) of the wafer 11. The template 15 is made of, for example, a fully transparent quartz substrate and has a pattern of projections and recesses formed by plasma etching, etc., on a surface thereof that faces the principal surface of the wafer 11.

Ultraviolet rays emitted from a UV light source 16 are irradiated through the template 15 onto a photocuring resist made of a photocuring resin, etc., which is an imprint material (mask material) formed on the principal surface of the wafer 11.

Furthermore, an imprint nozzle 17 is disposed so as to face the principal surface of the wafer 11. The photocuring resist which is the imprint material is applied to the principal surface of the wafer 11 by an inkjet method.

The position and amount of movement of the wafer stage 12, the contact operation and release operation of the template 15 with respect to the wafer 11, the focal position and amount of light of the UV light source 16, the discharge pattern and amount of discharge of an imprint material from the imprint nozzle 17, and the like, are controlled by a control apparatus 19 based on various data stored in a recipe storage apparatus 18.

By the photo-nanoimprint apparatus having such a configuration, an application step of a photocuring resist to the wafer 11, an alignment step of the wafer 11 and the template 15, a pressing (contact) step of the wafer 11 and the template 15, a photocuring resist curing step, and a release step of the template 15 can be continuously performed.

Figure 2:
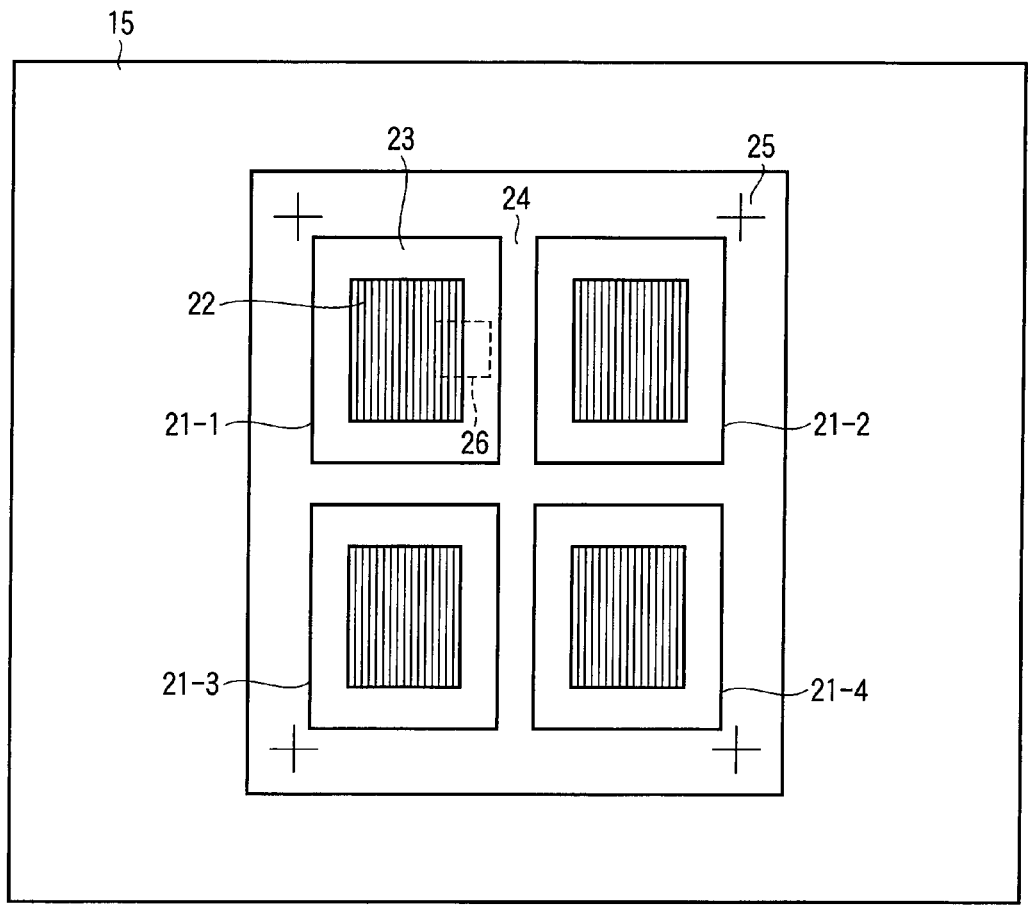
FIG. 2 is a plan view of memory devices, showing an exemplary pattern layout formed by methods of manufacturing semiconductor devices according to embodiments of the present invention.

FIG. 2 shows an exemplary recess pattern layout of the template 15 shown in FIG. 1. In the template 15, memory devices are taken as an example and here a pattern of four chips 21-1 to 21-4 is representatively shown in a simplified manner. A memory cell pattern (main pattern region 22) formed in lines and spaces is arranged at a central portion of each of the chips 21-1 to 21-4. a peripheral circuit pattern region 23 is formed Outside the memory cell pattern. Furthermore, a dicing region 24 serving as a cutting margin of the chips 21-1 to 21-4 is provided between the chips 21-1 to 21-4 and outside the peripheral circuit pattern regions 23. Alignment marks 25 for alignment are formed in the dicing region 24, etc.

FIGS. 3 to 9 are cross-sectional views describing a method of manufacturing a semiconductor device according to a first embodiment of the present invention, and sequentially showing steps of forming a pattern such as that shown in FIG. 2, using the photo-nanoimprint apparatus shown in FIG. 1. FIGS. 3 to 9 show manufacturing steps, extracting a part of a main pattern region 22 and a peripheral circuit pattern region 23 (a region enclosed by a dashed line 26) in the pattern layout in FIG. 2.

Figure 11A:
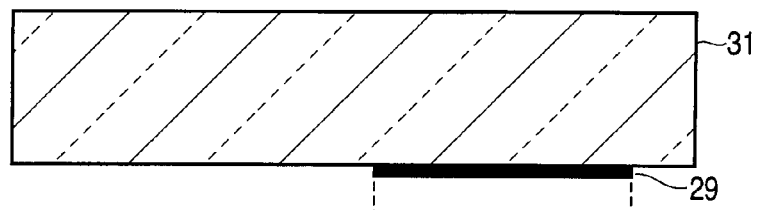
FIG. 11A is a cross-sectional view of a reticle used in a photolithography step.
Figure 11B:
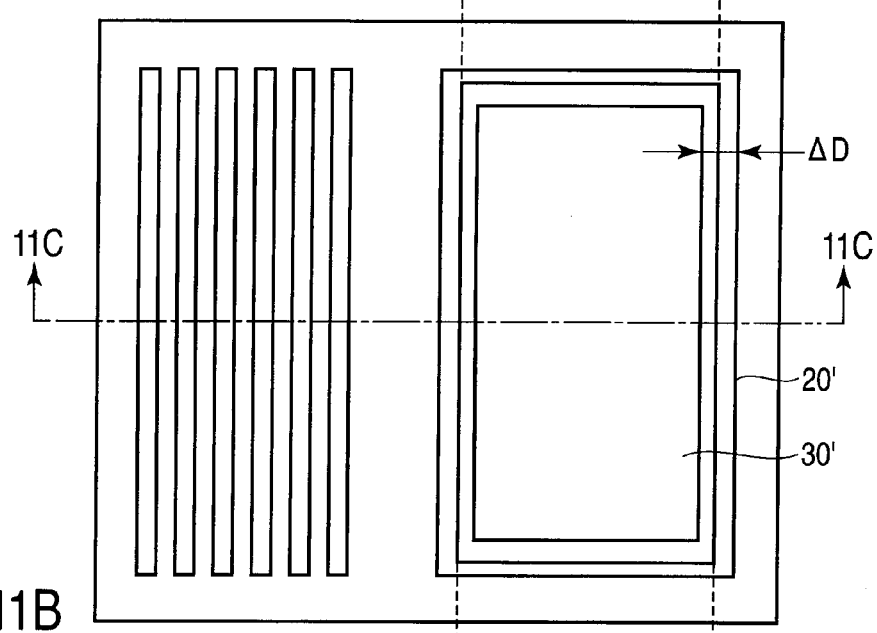
FIG. 11B is a plan view of a formed radiation-sensitive resist pattern and the formed imprint pattern.
Figure 11C:
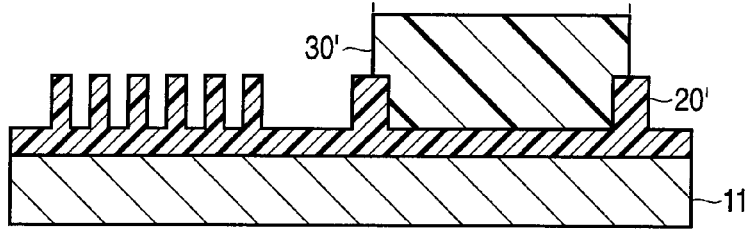
FIG. 11C is a cross-sectional view of the substrate to be processed and a radiation-sensitive resist.
Figure 12A:
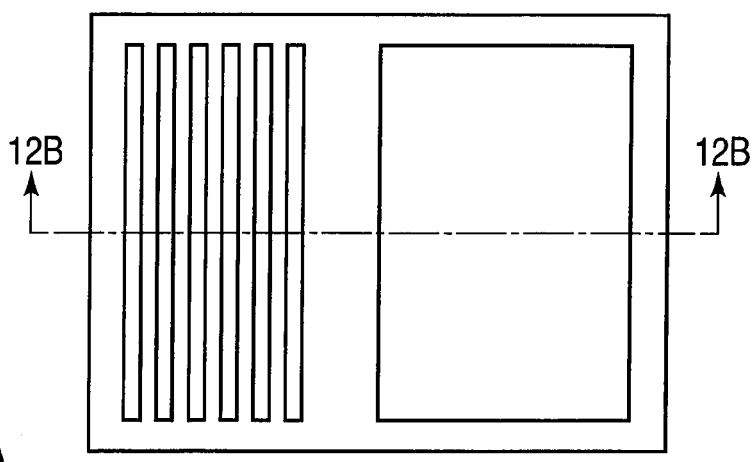
FIG. 12A is a plan view of a pattern transferred to the subject processing substrate.
Figure 12B:
FIG. 12B is a cross-sectional view of the subject processing substrate.

FIGS. 10A to 12B are diagrams respectively for specifically describing a photo-nanoimprint step, a radiation lithography step (a lithography step using light in the description of the present embodiment), and a pattern transferred to a wafer (substrate to be processed). FIG. 10A is a cross-sectional view of a template used in a photo-nanoimprint step. FIG. 10B is a plan view of a formed imprint pattern (mask material pattern) of an imprint resist. FIG. 10C is a cross-sectional view of a wafer (substrate to be processed) 11 and the imprint pattern, taken along line 10C-10C of FIG. 10B. FIG. 11A is a cross-sectional view of a reticle used in a photolithography step. FIG. 11B is a plan view of a formed radiation-sensitive resist pattern and the formed imprint pattern. FIG. 11C is a cross-sectional view of the substrate to be processed and a radiation-sensitive resist, taken along line 11C-11C of FIG. 11B. FIG. 12A is a plan view of a pattern transferred to the subject processing substrate. FIG. 12B is a cross-sectional view taken along line 12B-12B of FIG. 12A.

Figure 3:
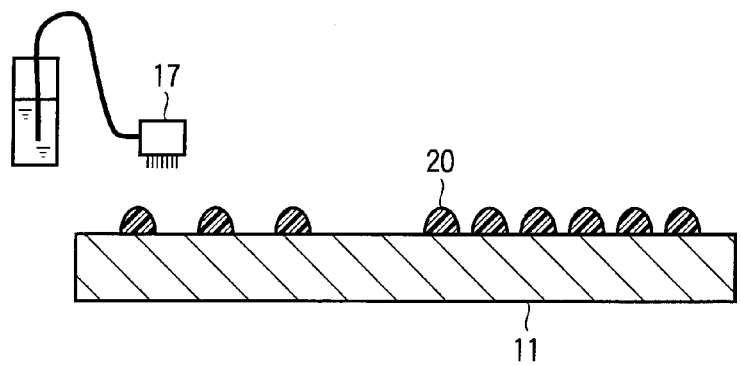

First, a nanoimprint material (mask material) is applied by an inkjet method to a surface of a substrate to be processed (wafer). Specifically, as shown in FIG. 3, one shot of a liquid photocuring resist (radiation-sensitive resist) 20 is applied to a surface of a substrate 11 to be processed from the imprint nozzle 17. At this time, the photo-nanoimprint apparatus computes in advance a required amount of the photocuring resist 20 from pattern information of a template 15 and then applies the photocuring resist 20. For example, the control apparatus 19 reads an amount of discharge from mask pattern data stored in the recipe storage apparatus 18, creates a discharge pattern of an imprint material according to the density of a pattern, and thereby controls the amount of discharge from the imprint nozzle 17.

The substrate 11 to be processed is a silicon substrate, for example. On the silicon substrate, a silicon oxide film serving as a film to be processed, an interlayer insulating film such as a low-k (low permittivity) film, a mask material film made of an organic film, or the like, may be formed. Also, to enhance adhesion between the substrate and an imprint resist, an organic film may be provided on the substrate. Furthermore, a device pattern in a device manufacturing process may be formed on a lower layer of the substrate 11 to be processed.

Next, a nanoimprint template 15 such as that shown in FIG. 10A is prepared. The template 15 is, for example, a fully transparent quartz substrate used for photomasks, on which a pattern of projections and recesses is formed by plasma etching. The projection and recess pattern is divided into groups: a group of a small pattern 27 (second recess pattern) having projections and recesses with which sufficient capillary force can be obtained and a group of a specific pattern 28A (first recess pattern) different from the pattern 27. The small pattern 27 is formed based on mask pattern data and the specific pattern 28A is formed only in an circumference along an outline. The size of the specific pattern 28A is not particularly limited but the specific pattern 28A is, for example, a pattern which is larger in size than the pattern 27 and with which sufficient capillary force cannot be obtained.

Specifically, the small pattern 27 having projections and recesses that can cause a capillary phenomenon is formed in a first region of a surface of the template 15 facing the surface where the photocuring resist 20 is applied. The specific pattern 28A larger than or equal to a specific size having a small capillary force is formed in a second region different from the first region.

The specific pattern 28A has a recess-like frame pattern (groove 35) along an outline of a mask material pattern to be formed on the substrate upon processing the substrate. The pattern 28A may further have another recess pattern (groove) in the pattern having a recess-like frame. Specifically, the pattern 28A may have, for example, a rectangular pattern having lengths, in an x-direction and a y-direction, of 1 μm or more or a combined pattern thereof.

The width ΔD of the groove 35 has at least equal to an alignment accuracy of an exposure apparatus used in a photolithography step which is performed later. When the alignment accuracy in the x- or y-direction is ±50 nm, it is desirable that the width ΔD be 100 nm or more. Consequently, even when misalignment occurs, ends of a radiation-sensitive resist pattern formed by a photolithography method can always be located on an imprint pattern (mask material pattern).

To determine the size of the recess of the specific pattern 28A, a template where a plurality of recess patterns with different sizes are formed is prepared and a relationship between the size of a recess and the filling time during which the recess is filled with an imprint resist is obtained for each of the recesses with different sizes. Then, a size is determined for which filling is completed in a filing time that is determined by the throughput, etc., required by the photo-nanoimprint apparatus. Based on this result, the size of the recess of the specific pattern 28A is determined. Alternatively, speeds of filling recesses with an imprint resist may be obtained by simulation and the size of the recess of the specific pattern 28A may be determined based on the results of simulation.

Note that the width ΔD of the groove 35 may be different between the x-direction and the y-direction and it is desirable that the width ΔD be determined by the alignment accuracy of the exposure apparatus.

Figure 4:
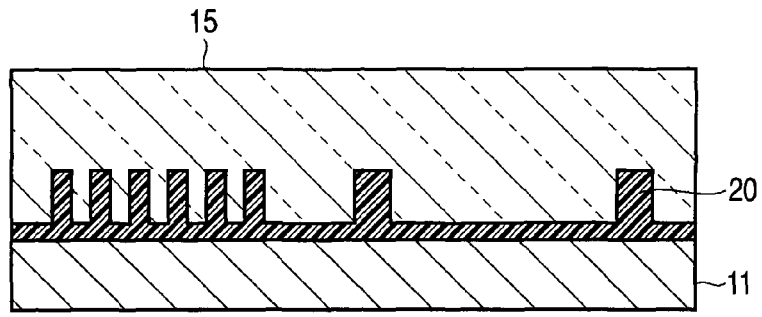
Figure 5:
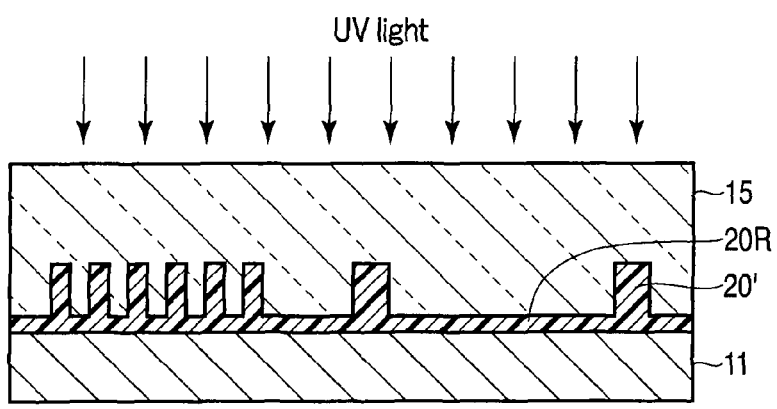

Next, as shown in FIG. 4, the template 15 is aligned with respect to the substrate 11 to be processed. Thereafter, the template 15 is pressed against (brought into contact with) the photocuring resist 20. After the pressing step, as shown in FIG. 5, UV light including the wavelength of an i-ray, etc., is irradiated to cure the photocuring resist 20, whereby an imprint resist pattern (imprint pattern) 20' is formed. A portion of the imprint pattern (mask material pattern) 20' corresponding to the specific pattern 28A has a groove on the inner side of the circumference thereof. Note that remaining films 20R of the mask material which are not patterned are formed at the bottom of the mask material pattern.

Figure 6:
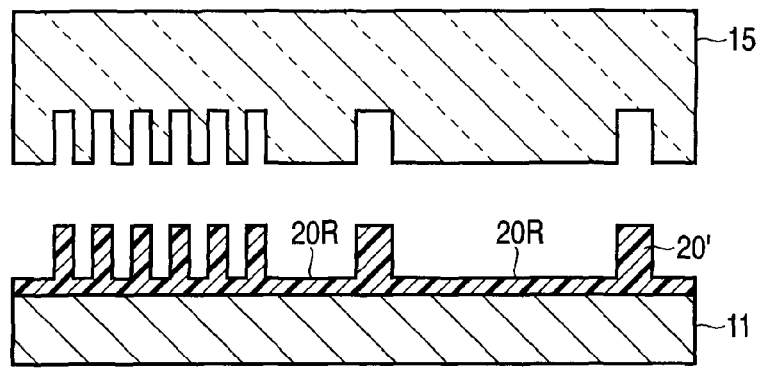

Subsequently, as shown in FIG. 6, the template 15 is released and rinse and remaining film removing steps are performed. The remaining film removing step may be performed before applying a positive radiation-sensitive resist 30 but the present embodiment takes, as an example, the case of performing the remaining film removing step after forming a radiation-sensitive resist pattern.

Figure 7:
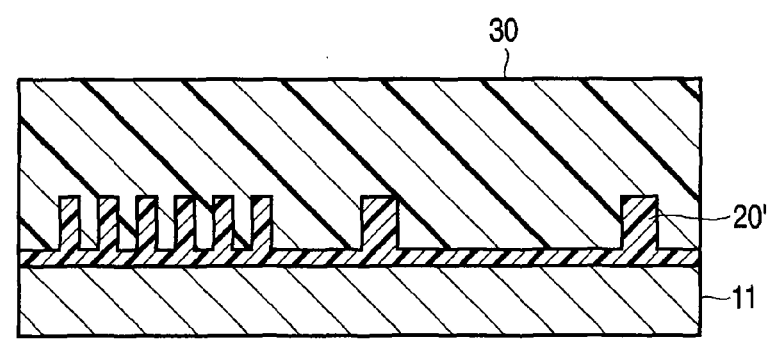

Then, a process for promoting adhesion using hexamethyldisilazane (HMDS), etc., is performed, if necessary, on the substrate 11 to be processed having the imprint pattern 20'. Thereafter, as shown in FIG. 7, a positive radiation-sensitive resist 30 (resist 30) is applied onto the imprint pattern 20'. At this time, the imprint pattern 20' is already photocured. Thus, it is rare for the imprint pattern 20' to be dissolved in a solvent in the resist 30.

Note, however, that if the hardness of photocuring is low and thus the imprint pattern 20' is dissolved in a solvent in the resist 30, an additional curing process such as a post-baking process or a UV curing process may be performed to suppress the dissolution of the imprint pattern 20'. The film thickness of the resist 30 should be one that is sufficient upon processing the film to be processed.

Subsequently, the substrate 11 to be processed having the resist 30 applied thereto is selectively exposed using a mask (reticle 31) such as that shown in FIG. 8. A light-shielding pattern 29 is formed on the reticle 31 so that the resist 30 remains in an inner region of the specific pattern.

Thereafter, a baking process is performed, if necessary, on a hotplate, etc., and a radiation-sensitive resist pattern 30' (resist pattern 30') is formed using an alkaline developer such as a 2.38-wt % aqueous solution of tetramethylammonium hydroxide (TMAH) (FIG. 9). Edges of the resist pattern 30' are located on the circumference of the imprint pattern 20'. To take into account misalignment, the resist pattern 30' is formed such that a surface of the circumference of the imprint pattern 20' is exposed on the outer side of the edges of the resist pattern 30'. That is, as shown in FIGS. 11A to 11C, since the imprint pattern 20' has a sufficient margin of the width ΔD, end edges of the resist pattern 30' almost never go outside ends of the imprint pattern 20'.

Then, the remaining films 20R of the mask material are processed by using the imprint pattern 20' and the resist pattern 30' as a mask.

Thereafter, the substrate 11 to be processed is patterned using a mask of a combined structure of the imprint pattern 20' and the resist pattern 30'. Thereafter, resist residues on a substrate 11' to be processed on which etching for the patterning has been completed are removed. The resist residues are removed by using oxygen plasma ashing or a mixed solution of sulfuric acid and an aqueous solution of hydrogen peroxide, a commercially available resist remover, or the like. Consequently, a desired pattern such as that shown in FIGS. 12A and 12B can be formed on a surface of the substrate to be processed 11'.

According to a method of manufacturing a semiconductor device such as that described above, a pattern with a large capillary force is formed by a nanoimprint method and a pattern with a small capillary force is formed by a combination of a nanoimprint method and a radiation lithography method (using ultraviolet light such as DUV or EUV, or an electronic beam). That is, in a portion of a mask material pattern corresponding to the pattern with a small capillary force, only a pattern of an circumference is formed by a nanoimprint method and a pattern of an inside the circumference is formed by a lithography method. Therefore, since a pattern that is formed by a nanoimprint method is only the circumference, the capillary force increases, enabling deficient filling with an imprint resist to be reduced.

An circumference of a predetermined mask material pattern to be formed is formed by imprinting a frame-like recess template pattern and a resist is formed in a region surrounded by the circumference of the mask material pattern. Hence, ends of the resist are to be located on the frame-like mask material pattern and a margin corresponding to a line width (width ΔD of the groove 35) can be kept, enabling to suppress misalignment in a mix and match of an imprint method and a lithography method.

Figure 13A:
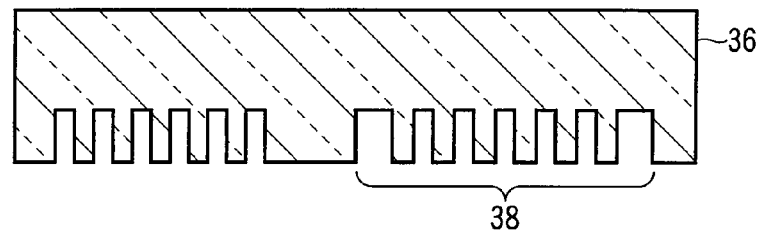
FIG. 13A is a cross-sectional view showing a first variant of a template used in a photo-nanoimprint step.
Figure 13B:
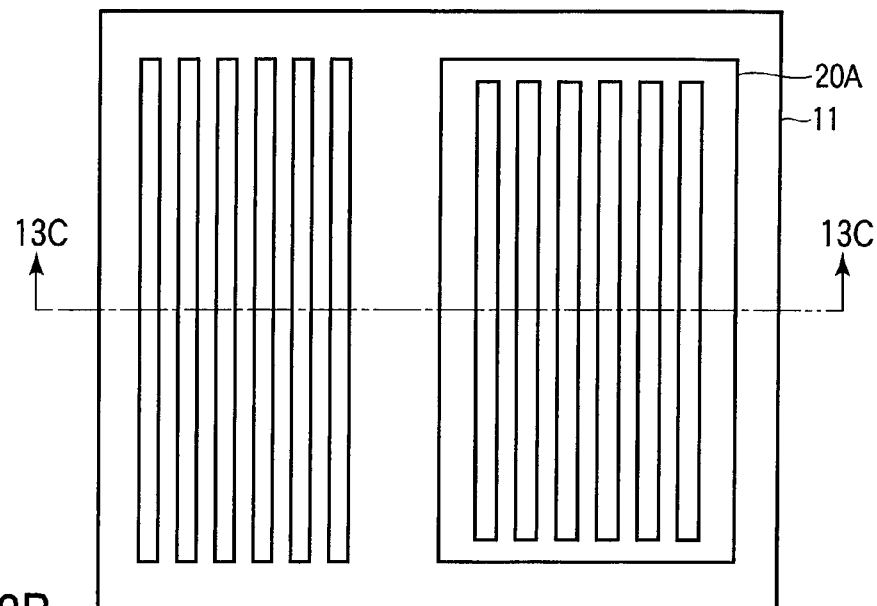
FIG. 13B is a plan view showing the first variant of a formed imprint pattern.
Figure 13C:
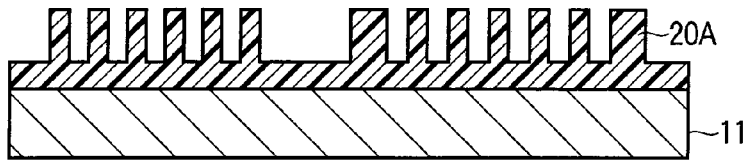
FIG. 13C is a cross-sectional view showing the first variant of a substrate to be processed and the imprint pattern.

Note that although in the first embodiment a frame-like recess template pattern along an circumference of a predetermined mask material pattern is used, as shown in FIGS. 13A to 13C, for example, a template pattern may be used that has not only an circumference along an outline of a mask material pattern but also grooves on the inner side of the circumference. Namely, a recess pattern may be formed in dummy lines and spaces in an inner region 38 of a specific pattern of a template 36 to increase capillary force.

Figures 14A, 14B, 14C:
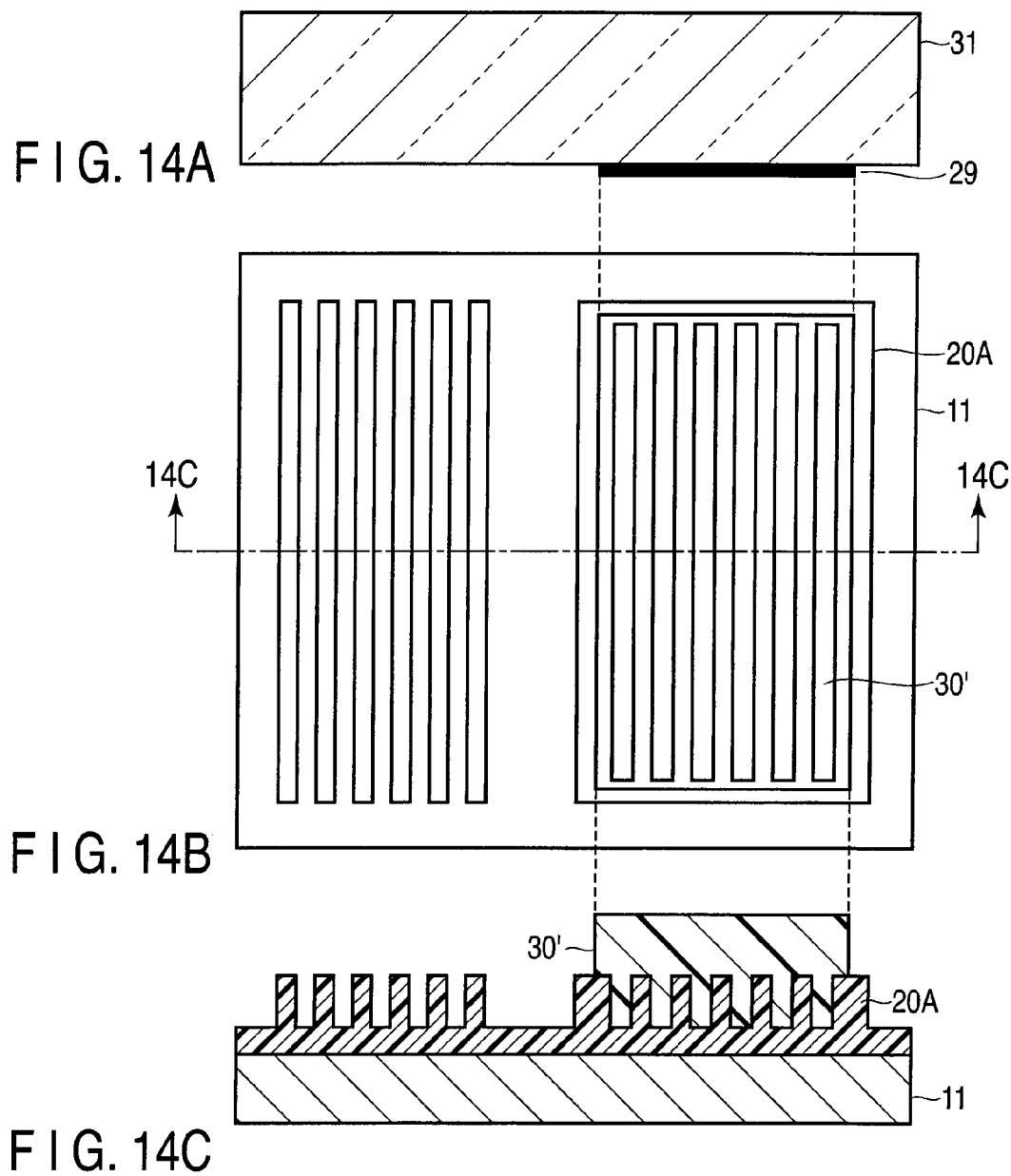
FIG. 14A is a cross-sectional view of a reticle used in a photolithography step.
FIG. 14B is a plan view showing the first variant of a formed radiation-sensitive resist pattern and the formed imprint pattern.
FIG. 14C is a cross-sectional view showing the first variant of the substrate to be processed and a radiation-sensitive resist.
Figure 15A:
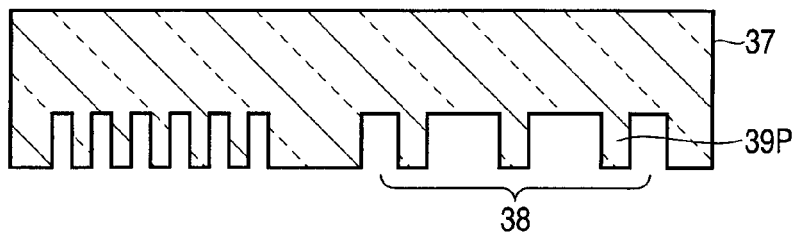
FIG. 15A is a cross-sectional view showing a second variant of a template used in a photo-nanoimprint step.
Figure 15B:
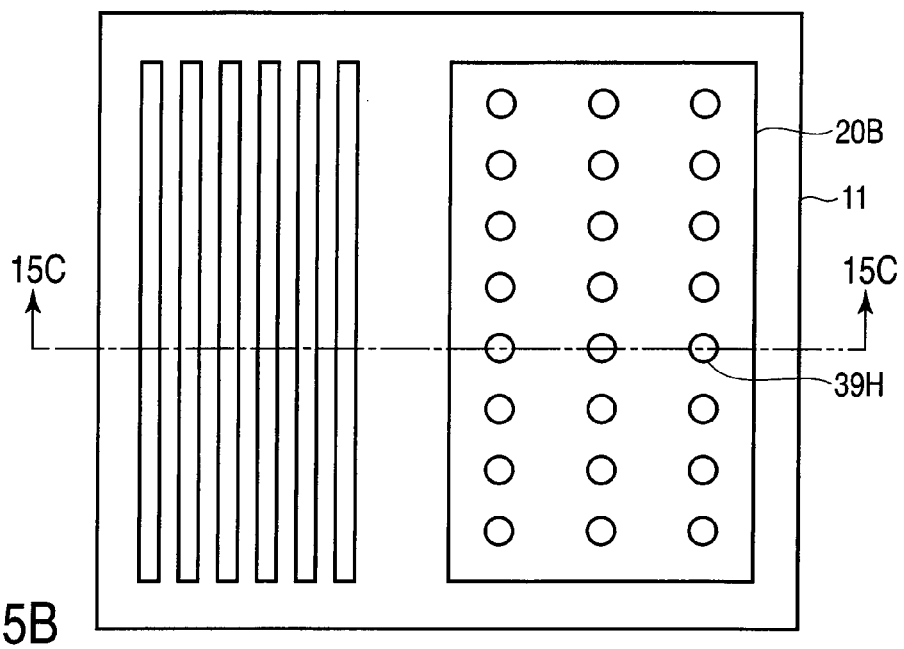
FIG. 15B is a plan view showing the second variant of a formed imprint pattern.
Figure 15C:
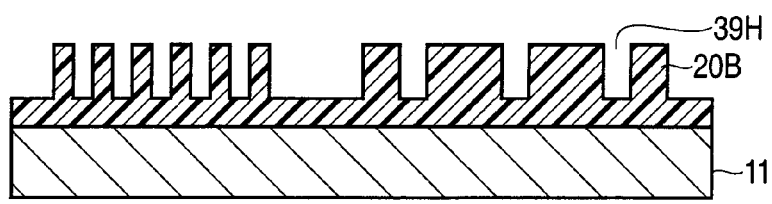
FIG. 15C is a cross-sectional view showing the second variant of a substrate to be processed and the imprint pattern.
Figure 16A:
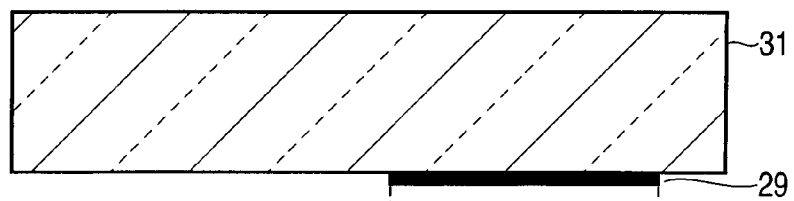
FIG. 16A is a cross-sectional view of a reticle used in a photolithography step.
Figure 16B:
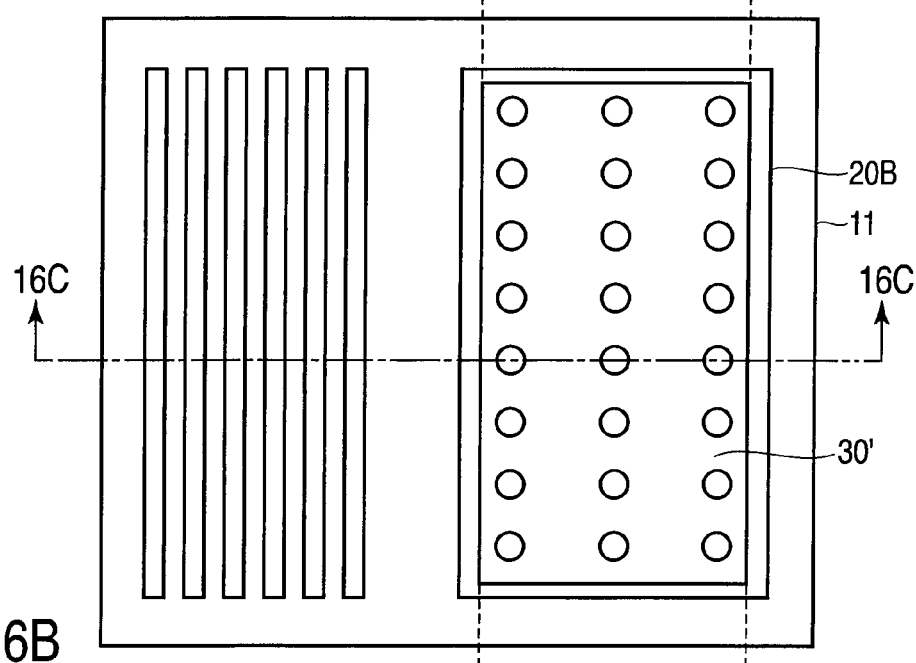
FIG. 16B is a plan view showing the second variant of a formed radiation-sensitive resist pattern and the formed imprint pattern.
Figure 16C:
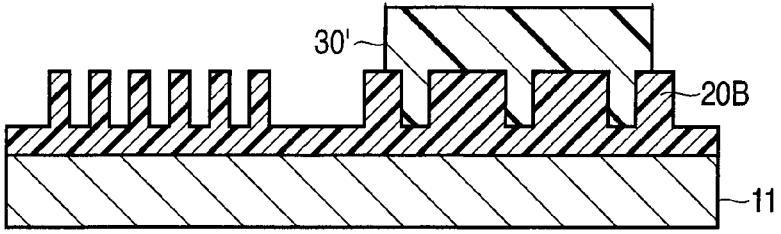
FIG. 16C is a cross-sectional view showing the second variant of the substrate to be processed and the radiation-sensitive resist.

A resist pattern 30' is formed, as shown in FIGS. 14A to 14C, in the inner region 38 of the specific pattern. Consequently, as with the first embodiment, a substrate 11 to be processed is patterned using a mask of a combined structure of an imprint pattern 20A and the resist pattern 30'.

According to a method of manufacturing a semiconductor device such as that described above, in addition to an circumference along an outline of a specific pattern, projections and recesses in lines and spaces are formed in an inner region 38. Thus, even in a large pattern, filling with an imprint resist can be easily achieved by capillary force.

Alternatively, instead of projections and recesses in lines and spaces, as shown in FIGS. 15A to 15C and 16A to 16C, cylindrical posts 39P may be arranged in a matrix in an inner region 38 of a specific pattern of a template 37. Namely, holes 39H (recess pattern) may be formed in a matrix in the specific pattern of an imprint pattern 20B to increase capillary force.

Even with such a configuration and a method, substantially the same actions and effects as those of the case of forming projections and recesses in lines and spaces can be obtained.

By patterning the substrate 11 to be processed using a mask of a combined structure of the imprint pattern 20' which are formed based on the recess pattern 28 of the template and the resist pattern 30', alignment marks, misalignment check marks, or the like, can be formed on peripheral circuit patterns of memory cells or dicing lines.

On the other hand, by patterning the substrate 11 to be processed using, as a mask, the imprint pattern 20' which is formed based on the recess pattern 28 of the template, a fine memory cell pattern, for example, can be formed.

Note that here by forming the resist pattern 30' so as to cover at least a part of the mask material pattern 20' corresponding to the recess pattern 28 of the template and adjacent to a fine mask material pattern corresponding to the recess pattern 27 of the template, an influence of misalignment of the fine mask material pattern and the resist pattern 30' adjacent thereto can be prevented.

Second Embodiment

Figure 23A:
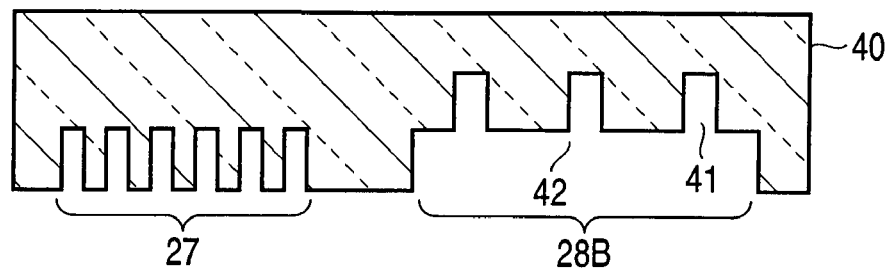
FIG. 23A is a cross-sectional view of a template used in a photo-nanoimprint step.
Figure 23B:
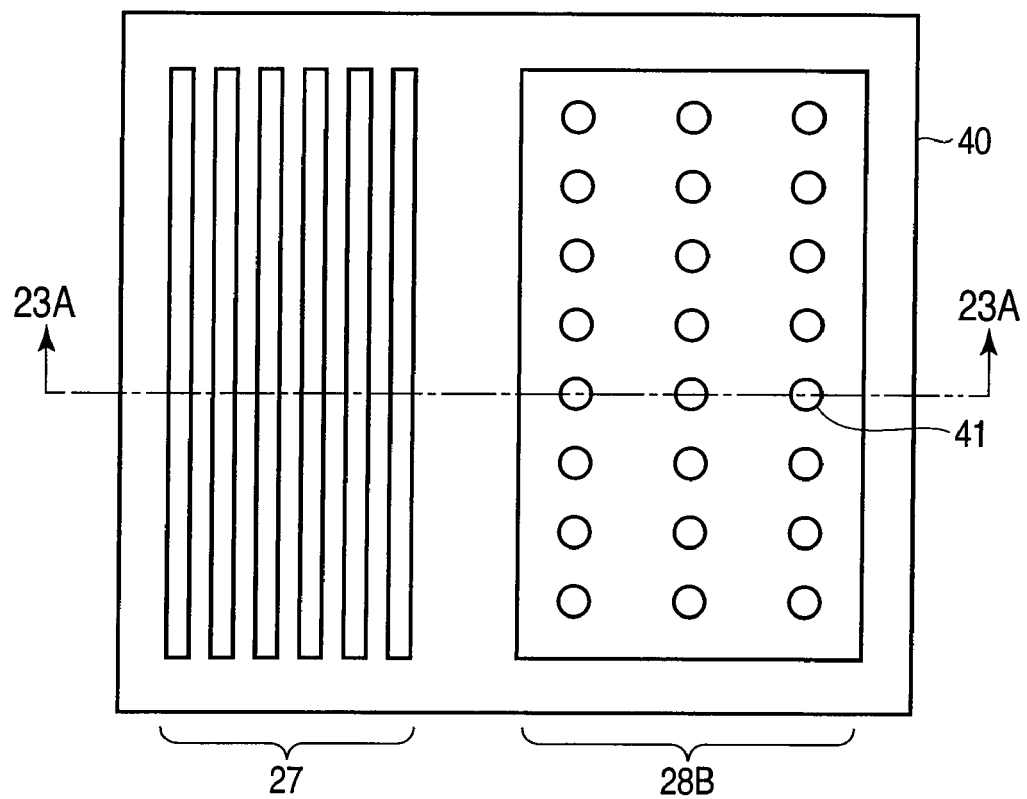
FIG. 23B is a plan view of a formed imprint pattern.

FIGS. 17 to 22 are cross-sectional views describing a method of manufacturing a semiconductor device by a photoimprint method according to a second embodiment of the present invention, and sequentially showing manufacturing steps. As with the aforementioned first embodiment, in the present embodiment, too, the drawings show manufacturing steps, extracting a part of a main pattern region 22 and a peripheral circuit pattern region 23 (a region enclosed by a dashed line 26) in the pattern layout in FIG. 2. FIG. 23A is a cross-sectional view of a template used in the present embodiment and is a cross section taken along line 23A-23A of FIG. 23B. FIG. 23B is a plan view as seen from the bottom of the template.

Figure 17:
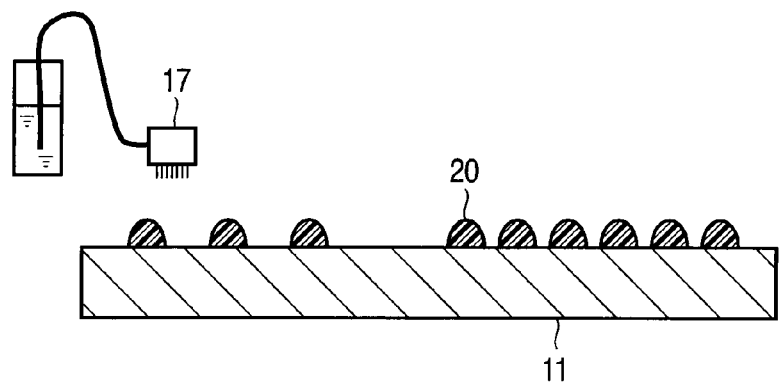

First, a nanoimprint material (mask material) is applied by an inkjet method to a surface of a substrate to be processed (wafer). Specifically, as shown in FIG. 17, one shot of a liquid photocuring resist 20 is applied to a surface of a substrate 11 to be processed from the imprint nozzle 17. At this time, the photo-nanoimprint apparatus computes in advance a required amount of the photocuring resist 20 from pattern information of a template and then applies the photocuring resist 20. For example, the control apparatus 19 reads an amount of discharge from mask pattern data stored in the recipe storage apparatus 18, creates a discharge pattern of an imprint material according to the density of a pattern, and thereby controls the amount of discharge from the imprint nozzle 17.

The substrate 11 to be processed may be a silicon substrate, as with the first embodiment. The substrate 11 to be processed may be a silicon substrate having formed thereon a silicon oxide film serving as a film to be processed, an interlayer insulating film such as a low-k (low permittivity) film, a mask material film made of an organic film, or the like. An organic film for enhancing adhesion between the substrate and an imprint resist may be provided. Furthermore, a device pattern in a device manufacturing process may be formed on a lower layer of the substrate 11 to be processed.

Figure 18:
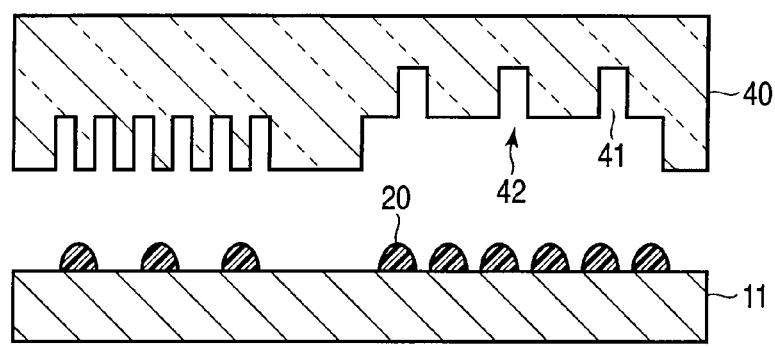

Next, as shown in FIG. 18, a nanoimprint template 40 is prepared and the template 40 is aligned with respect to the substrate 11 to be processed. The template 40 is, for example, a fully transparent quartz substrate which is used for general photomasks, on which a pattern of projections and recesses is formed by plasma etching.

As shown in FIGS. 23A and 23B, the template 40 has a small pattern (first recess pattern) 27 formed in projections and recesses that can cause a capillary phenomenon, in a first region of a surface thereof facing the photocuring resist 20; and a specific pattern (second recess pattern) 28B larger than the first recess pattern 27, e.g., larger than or equal to a specific size having a small capillary force, in a second region different from the first region. That is, the pattern is divided into groups: a group of the small pattern 27 with which sufficient capillary force can be obtained and a group of the specific pattern 28B having a small capillary force. The small pattern 27 is formed based on mask pattern data. Grooves (holes) 41 are provided so as to be arranged in a matrix on bottom faces of recesses 42 for forming the specific pattern 28B. In other words, the template 40 has the second recess pattern 28B that is larger in size than the first recess pattern 27 and that has grooves (holes) formed on a bottom face thereof.

The specific pattern 28B is formed by, for example, a rectangle having lengths, in an x-direction and a y-direction, of 1 μm or more or recesses 42 in a combination therewith. On the bottom faces of the recesses 42, the holes 41 are provided so as to be arranged in a matrix. By means of the holes 41, the capillary force is increased, whereby filling the recesses 42 with an imprint resist is assisted.

To determine the size of the specific pattern 28B, a template where a plurality of patterns with different sizes are formed is prepared and a relationship between the size of a recess 42 and the filling time during which the recess 42 is filled with an imprint resist is obtained for each of recesses 42 with different sizes. Then, a size is determined with which filling is completed in a filing time that is determined by the throughput, etc., required by the photo-nanoimprint apparatus. At this time, due to the capillary force of the holes 41, the imprint resist filling time is less than that in the case of the first embodiment. Based on this result, the size of the specific pattern 28B is determined. Alternatively, speeds of filling recesses 42 with an imprint resist may be obtained by simulation and the size of the specific pattern 28B may be determined based on the results of simulation.

The size and arrangement pitch of the holes 41 are determined as follows. A template where a plurality of patterns with different sizes and different arrangement pitches are formed is prepared and a relationship between the size and arrangement pitch of a recess of a specific pattern and the filling time during which the recess of a specific pattern is filled with an imprint resist is obtained for each of the recesses with different sizes and different arrangement pitches. A size and a pitch are determined with which filling is completed in a filing time that is determined by the throughput, etc., required by the photo-nanoimprint apparatus. Then, based on the result, the size and the pitch may be determined. Alternatively, speeds of filling recesses 42 with an imprint resist may be obtained by simulation and the size and the pitch may be determined based on the results of simulation.

Figure 19:
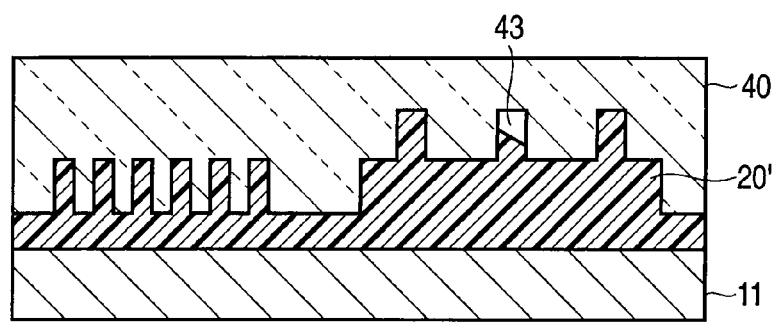

Thereafter, as shown in FIG. 19, the template 40 is pressed against (brought into contact with) the photocuring resist 20. After the pressing step, as shown in FIG. 20, UV light including the wavelength of an i-ray, etc., is irradiated to cure the photocuring resist 20.

Then, as shown in FIG. 21, the template 40 is released and rinse and remaining film removing steps are performed.

Subsequently, as shown in FIG. 22, the substrate to be processed 11 is patterned using, as a mask, an imprint pattern 20'. Thereafter, resist residues on the substrate to be processed 11 on which the patterning has been completed are removed by oxygen plasma ashing or a mixed solution of sulfuric acid and an aqueous solution of hydrogen peroxide, a commercially available resist remover, or the like. Consequently, a desired pattern made of the substrate to be processed 11 can be formed.

According to a method of manufacturing a semiconductor device such as that described above, holes 41 are formed on a bottom face of a specific pattern 28B. Because of the capillary force of the holes 41, the filling of recesses 42 with an imprint resist 20 can be assisted, enabling deficient filling with the imprint resist 20 to be reduced.

Moreover, since a mix and match of an imprint method and a lithography method does not need to be performed, deficient filling with an imprint resist can be reduced by simpler steps than those in the first embodiment.

Note that although in the step shown in FIG. 19 a deficiently filled portion 43 may be present in a hole 41, the deficiently filled portion 43 is not directly involved in formation of a specific pattern 28B and thus does not cause substantial adverse effects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    bringing a template having a first recess pattern into contact with a mask material formed on a substrate;
    curing the mask material with which the first recess pattern is filled;
    forming a mask material pattern on the substrate by releasing the template from the mask material after curing the mask material;
    forming a resist pattern to cover a part of the mask material pattern by forming a resist that is cured by radiation on the mask material pattern and selectively irradiating radiation onto the resist and thereafter developing the resist; and
    processing the substrate by using the mask material pattern and the resist pattern as a mask.

2. The method according to claim 1, wherein
    the mask material pattern has a groove on an inner side of a circumference thereof,
    edges of the resist pattern are located on the circumference, and
    a surface of the circumference is exposed on an outer side of the edges of the resist pattern.

3. The method according to claim 2, wherein the groove is formed in lines and spaces on the inner side of the circumference.

4. The method according to claim 2, wherein the groove is formed in a matrix on the inner side of the circumference.

5. The method according to claim 1, wherein before processing the substrate, a remaining portion of the mask material is processed by using the mask material pattern and the resist pattern as a mask.

6. The method according to claim 1, wherein the first recess pattern is a rectangular pattern and a length, in a first direction, of the rectangular pattern and a length, in a second direction orthogonal to the first direction, of the rectangular pattern are 1 μm or more.

7. The method according to claim 1, wherein
    the template further has a second recess pattern,
    the second recess pattern has a size smaller than a total size of the resist pattern and the mask material pattern, a part of which is covered by the resist pattern,
    when the first recess pattern is filled with the mask material, the second recess pattern is also filled with the mask material,
    the mask material pattern corresponding to the first and the second recess patterns is formed on the substrate by releasing the template from the mask material after curing the mask material, and the resist pattern is formed so as to cover only a part of a portion of the mask material pattern corresponding to the first recess pattern.

8. The method according to claim 7, wherein the portion of the mask material pattern corresponding to the first recess pattern is adjacent to a portion of the mask material pattern corresponding to the second recess pattern.

* * * * *